United States Patent
Chen et al.

(10) Patent No.: US 8,341,568 B2
(45) Date of Patent: Dec. 25, 2012

(54) SYSTEMS AND METHODS FOR LOGIC VERIFICATION

(75) Inventors: Fei Chen, Newark, DE (US); Guang R. Gao, Newark, DE (US)

(73) Assignee: ET International, Inc., Newark, DE (US)

( * ) Notice: Subject to any disclaimer, the term of this patent is extended or adjusted under 35 U.S.C. 154(b) by 154 days.

(21) Appl. No.: 12/840,543

(22) Filed: Jul. 21, 2010

(65) Prior Publication Data

US 2010/0286976 A1    Nov. 11, 2010

Related U.S. Application Data

(62) Division of application No. 11/937,577, filed on Nov. 9, 2007, now Pat. No. 7,934,179.

(60) Provisional application No. 60/866,517, filed on Nov. 20, 2006.

(51) Int. Cl.
  *G06F 17/50* (2006.01)
  *G06F 9/455* (2006.01)

(52) U.S. Cl. ............... 716/106; 716/100; 703/15
(58) Field of Classification Search ............ 716/100, 716/106; 703/15
See application file for complete search history.

(56) References Cited

U.S. PATENT DOCUMENTS

| | | | |
|---|---|---|---|
| 4,306,286 A | 12/1981 | Cocke et al. | |
| 4,697,241 A | 9/1987 | Lavi et al. | |
| 4,914,612 A | 4/1990 | Beece et al. | |
| 5,850,553 A * | 12/1998 | Schlansker et al. | 717/155 |
| 7,260,794 B2 | 8/2007 | Butts | |
| 7,421,566 B2 * | 9/2008 | Gschwind et al. | 712/216 |
| 2005/0114629 A1 * | 5/2005 | Altman et al. | 712/209 |
| 2005/0160097 A1 * | 7/2005 | Gschwind et al. | 707/10 |

* cited by examiner

*Primary Examiner* — Vuthe Siek
*Assistant Examiner* — Magid Dimyan
(74) *Attorney, Agent, or Firm* — Connolly Bove Lodge & Hutz LLP

(57) ABSTRACT

Methods and systems for simulating logic may translate logic design into executable code for a multi-processor based parallel logic simulation device. A system may implement one or more parallel execution methods, which may include IPMD, MPMD, and/or DDMT.

11 Claims, 9 Drawing Sheets

SYSTEMS AND METHODS FOR LOGIC VERIFICATION

CROSS-REFERENCE TO RELATED APPLICATION

This application is a divisional application of U.S. patent application Ser. No. 11/937,577, filed Nov. 9, 2007, which claims the priority of U.S. Provisional Patent Application No. 60/866,517, filed on Nov. 20, 2006, both of which are incorporated herein by reference.

FIELD OF ENDEAVOR

Embodiments of the invention are may address multi-core chip architectures that may be used for logic verification and associated methods for using such architectures.

BACKGROUND OF THE INVENTION

Existing logic verification technology is mostly based on the use of field-programmable gate arrays (FPGAs), a cluster of computers (e.g., PCs), or specially designed application-specific integrated circuit (ASIC) systems.

Current FPGA-based technologies usually try to directly map the target logic into a group of FPGAs and to emulate the target system. This approach is not scalable and becomes extremely expensive as the complexity of the target logic increases. Also, the synthesizing processes normally takes a long time, which makes this approach very inefficient at the early stages of the chip logic development when design changes occur very often. Furthermore, FPGAs are intrinsically much slower than custom designed circuits.

The biggest problem of simulating complex chip logic on a PC cluster is the low performance. The main hindering factors come from instruction and data cache locality that are not well-suited to this type of simulation, inefficient communication channels, and operating system overhead.

Some companies have developed dedicated logic simulation machines with specially designed ASICs to accelerate the logic simulation process. Those systems are usually extremely expensive to develop and upgrade, and tend to be less flexible than other types of systems. The existing machines are generally not commercially available to outside users.

BRIEF DESCRIPTION OF THE DRAWINGS

Various embodiments of the invention will now be described in conjunction with the attached drawings, in which.

DETAILED DESCRIPTION OF VARIOUS EMBODIMENTS

Figure 1:
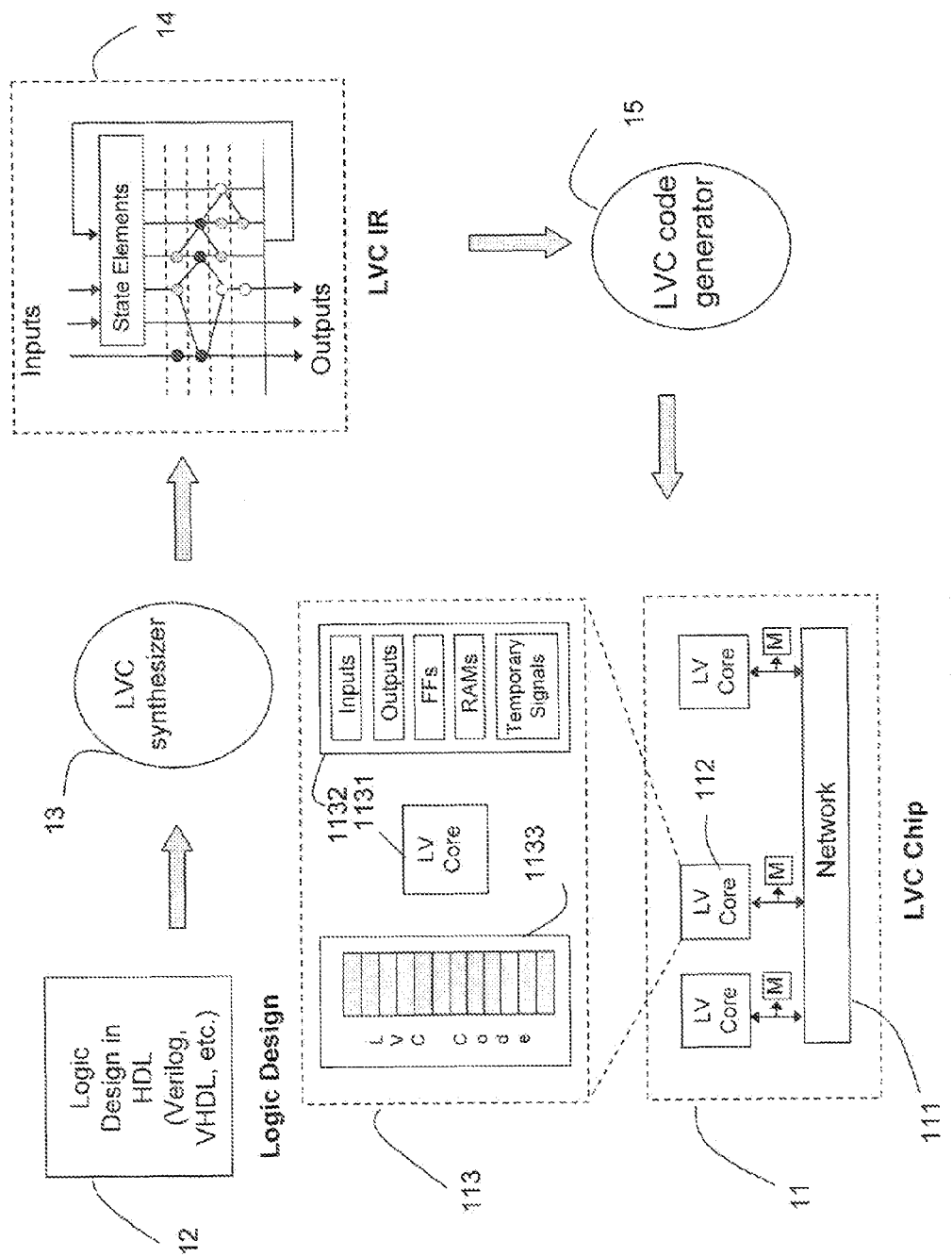
FIG. 1 shows a conceptual diagram of various aspects of various embodiments of the invention.

FIG. 1 shows a conceptual block/flow diagram that may be used to describe various embodiments of the invention. Embodiments of the invention may include a logic verification core (LVC) chip 11. LVC chip may include a number of LVCs 112, each of which may have an associated memory M, and which may be interconnected by means of a network 111. The associated memory M may be an individual memory component for each LVC 112, or the associated memory may comprise a portion of a larger memory component that may be shared among multiple LVCs 112.

An LVC 112 may comprise a logic verification core processor 1131 (which may be referred to below as "LP"), and may include local data memory to hold various associated components 1132, such as input, output, etc. The logic verification core processor may also include local instruction memory 1133 for the LVC to access for execution.

Under traditional event-driven simulation (e.g., CSim), events may be generated when logic cells (netlist design) or signal variables (RTL design) change their values. These events may be stored in an event queue and eventually consumed by the simulation engine to update affected logic cells (netlist design) or RTL processes (RTL design).

In contrast, in embodiments of the invention, the input logic design may be translated into a program composed by a set of primitive logic operations, which may be arranged in such a way that the dependencies between the operations in the original input are satisfied. This may be based, at least in part, on the principle that, no matter how complex a logic circuit, it may be mapped to a group of primitive logic operations, such as AND, OR, MUX, etc.

FIG. 1 further shows conceptually how an input logic design may be translated into code that may be used in the LVC chip 11. This process may be conceptually thought of as an LVC compiler, and the process as LVC compilation. Embodiments of the LVC compiler may be designed to structure the logic such that all state elements can be captured and represented by state elements that separate the execution of the logic itself to be combinational as shown in FIG. 1. A logic design 12, which may be written in a hardware description language (HDL), such as Verilog or VHDL, may be fed to an LVC synthesizer 13. The LVC synthesizer 13 may output an LVC intermediate representation (LVC IR) 14.

Note that the LVC synthesizer 13 may be designed such that LVC IR 14 may be able to represent both the functional/applicative subset of the translated logic program and the associated non-functional/imperative parts. Optimizations may then be applied to increase simulation speed, reduce resource usage, and make trade-offs between these two, while generating the final logic programs that are to be mapped on the LVCs 112. This may be accomplished by LVC code generator 15, whose output may then be provided to an LVC chip 11.

In embodiments of the invention, a logic simulation may be converted for execution of the logic programs on logic processors. The LVC compiler (13-15) may be used to bridge the gap between target logic design source 12 and the LVC simulation hardware. The LVC compiling process may be divided into two stages: the "front end" handled by the LVC synthesizer 13 and the "back end" handled by the LVC code generator 15. The target logic design 12 may be written in any hardware description language (HDL) (Verilog, VHDL, etc.) and any code style (RTL or netlist). At the first stage, an LVC synthesizer 13, an embodiment of which is shown in further detail in FIG. 2, may be used to translate original logic design 12 (which may be expressed in an HDL program) into LVC IR 14, which, according to some embodiments of the invention, may be likened to a "dataflow" program graph, where nodes may be used to represent logic operations and arcs may be used to represent data dependencies. In the second stage, LVC code generator 15 may then compile the LCV IR into machine level executable code that may be able to be run on the LVC chip 11 by the LVC cores 112. This LVC program may preserve the data dependences of the original LVC IR 14, while the predefined logic cells in the LVC IR 14 may be simulated with a set of simple, fixed-width, and pipelined LVC instructions.

As shown in FIG. 1, the LVC chip 11 may have many LVC cores 112 inter-connected by a network 111, which may be a fast crossbar network, for example. Different types of target logic designs may be partitioned, translated, and loaded with a LVC tool chain. Inputs to this program may include the input signals and original state bits, mapped to the memory cells. One iteration of the program execution on the logic processor may generate the output signals and the new state bits for the next iteration, which may then be mapped to the memory cells. A simulation of a logic design may include repetitive executions of the same program for a number of such iterations.

Figure 2:
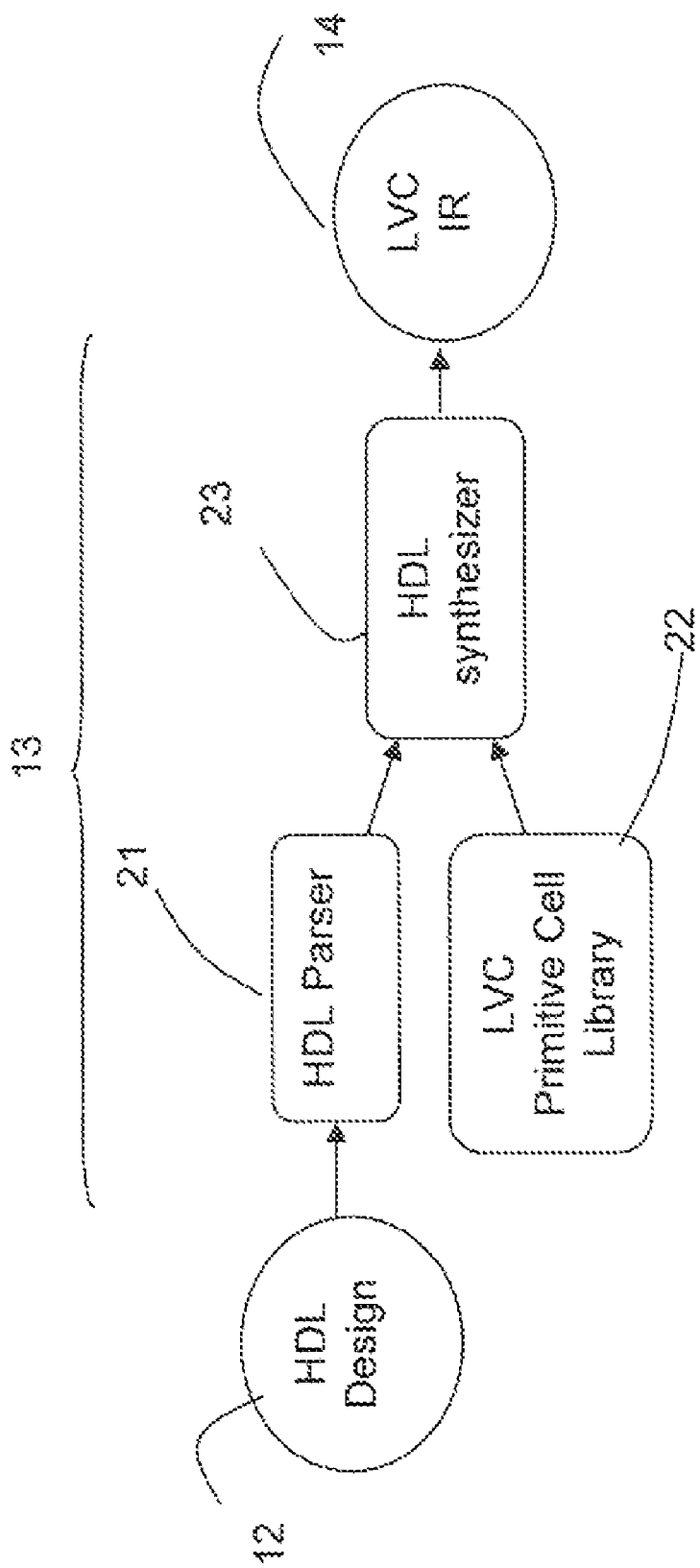
FIG. 2 shows a conceptual block diagram of a representation synthesizer according to an embodiment of the invention.

As shown in FIG. 2, the LVC synthesizer 13 may be used to translate the target logic design 12 into LVC IR 14. The coding style of the target logic design 12 is not restricted to RTL or Netlist. The translation process of LVC synthesizer 13 may be composed of two phases. In the first phase, the LVC synthesizer 13 may translate the source design 12 into a standard electronic design interchange format (EDIF) netlist format, using a parser 21. The EDIF netlist may still preserve a hierarchical structure. An LVC standard cell library 22 may be defined for a synthesizer 23 to generate the LVC IR output. In the second phase, the EDIF netlist may be translated by synthesizer 23 into LVC IR 14 in which the logic design may be viewed as having been "flattened," and the netlist may look more like a dependence graph composed of primitive logic cells. The LVC synthesizer 13 may generally not perform any kind of optimizations upon the design 12, to preserve the original logic structure for debugging purposes.

The LVC IR 14 may be thought of as a netlist composed of predefined primitive logic cells. The following is an example of an LVC IR 14:

---

Block ICache
  1 ZDIMES_DBG_FRP0_A WIRE Inputs I:1:W28
    Outputs W28 Width 28
  2 ZDIMES_DBG_FRP1_A WIRE Inputs I:4:W28
    Outputs W28 Width 28
  ...
  307 MC.DG.ZGROUP_EDGE.ZQ6 AND Inputs C:285:W1
    C:306:W1 Outputs W1
Width 1

-continued

308 MC.DG.ZGROUP_EDGE.ZQ7_1_1 CONST Inputs K:7
    Outputs W3 Width 3
  ...
  9952 ZX_TOP_HAVE GLUE Inputs C:7773:W1 C:7772:W1
C:7771:W1 C:7770:W1 C:7769:W1 C:7768:W1 C:7767:W1
C:7766:W1 C:7765:W1 C:7764:W1
Outputs W10 Width 10
Inputs
  1 FRP0_A[27:0]
  2 FRP0_HAVE
  ...
  39 CLK
Outputs
  1 TOP_D_0[511:0] C:9833:1
  2 TOP_D_1[511:0] C:9834:1
  ...
  30 MTB[3:0] C:870:1

---

This example is a LVC IR 14 that may represent a hypothetical instruction cache unit. The block in this example has 9952 nodes, each one of which may correspond to a primitive logic cell. Every node may be represented with one line of the statement that may include statement ID, statement name, logic operation type, input and output information, and width (bits). The input information may define the type of the incoming source, which may be any one of three sources: module input, constant, or output of other node. At the end of the LVC IR 14 definition, the module inputs and outputs may be defined. For the module outputs, the sources of the outputs may be specified with a statement ID that may be associated with each one of the outputs. Those statements may correspond to the nodes that have their outputs directly connected to the module outputs. Those primitive logic cells may handle signals with variable length. The LVC logic processors 112 may, in some embodiments, comprise fixed 8-bit processing units. Hence, this is why one may need the LVC code generator to translate the primitive logic cells in the LVC IR 14 into a set of even more primitive fixed-width LVC instructions that may be executed by fixed-width logic processors.

Aspects of embodiments of the invention on LVC code generation may feature a new method for register allocation and instruction scheduling that departs from the traditional implementation in normal optimizing compilers for general purpose microprocessors. In logic verification simulations, there may simply be too many variables for the classical register allocation algorithm to work effectively. Heuristic approaches may be developed to reducing the compilation time without a significant increase in the demand for storage resources.

The LVC code generator 15 is the "back end" of the LVC logic compiler. It may translate the LVC IR 14 into the LVC executables that may be executed by multiple LVC logic processors 112. The LVC code generator 15 may generally be aware of the architectural features of the LVC logic processors 112. Those features may include the on-chip data memory size for each execution engine, the on-chip instruction memory size, and so on. LVC code generator 15 may try to schedule the logic instructions of the logic program so that the temporary storage needed during execution can fit into the on-chip memory of the LVC chip 112. The LVC code generator 15 may also generate debugging information at the same time for signal tracing support.

From the compiler's point of view, the LVC IR 14 may be thought of as a "basic block" composed by logic instructions (or nodes). These logic instructions may generally belong to either of two categories: combinatorial and sequential. The majority of the gates, such as AND, OR, DECODE, and so on, may be combinatorial, and signals may propagate through them in a certain order. The rest of the logic nodes in the LVC IR 14 may be registers (or other sequential instructions). They may retain their values during a simulation cycle until, for example, the next rising edge of the simulated clock, when they may be updated with new values. Given this observation, the LVC IR 14 may also be thought of as a directed acyclic graph (DAG), and the logic instructions may be scheduled to maintain the dependences the DAG imposes.

For example, data storage for the register class of instructions may need to be specially treated with double buffering, one for an old value and one for a new value. The register buffer updating may generally take place between two simulations cycles. Finally, a separate storage space may be allocated for the inputs and the outputs of the "basic block", so that their values can be used to check the simulation result or to communicate with other simulated modules.

The LVC cores 112 may be implemented by simple stack processors. The use of a particular instruction set architecture (ISA) for the LVC cores 112 may be quite simple in that it may employ a simplified instruction set, compared to modern reduced instruction set computer (RISC) cores. For example, it may not be necessary to include operations on many data types (e.g., float types), nor many addressing modes. It may be supported by a very large instruction word (VLIW) structure that may be exploited by the LVC code generator 15 for multiple logic instruction issues.

The LVC chip architecture 11 may support three execution models: (1) IPMD; (2) MPMD model; (3) DDMT model. These will be discussed further below. The LVC compiler may be directed, e.g., by a user, by a setting in the logic design code, or some other means, to generate LVC code for one of these execution models.

Under an Identical Program Multiple Data (IPMD) execution model one single copy of the program may be shared by all the LVC cores 112, and all LVC cores 112 may execute the program independently. This model may particularly suitable to simulate an array of identical logic circuits and may be well-suited to simulate multiple cores in a multi-core chip. The repetitive functional units within a multi-core chip may be naturally mapped onto a group of LVC cores 112 that share the same target logic program.

Under a Multiple Program Multiple Data (MPMD) execution model, each LVC core 112 may execute its own copy of a program independently. The execution of the LVC cores 112 may be loosely-synchronized: the synchronization may be performed at properly placed barrier synchronizing points. At those synchronization points, interface signals may be exchanged between LVCs 112 to start the next simulation cycle.

Under a Data-Driven Multithreaded (DDMT) execution model, each LVC may execute its own program. The execution of the sections of the program may be driven by "events", which may correspond to data changes at the outputs of the primitive logic cells.

At the LVC chip level 11, embodiments of the invention may employ a multi-core architecture, which may use a shared memory organization, with or without relying on data caches. The explicit memory hierarchy may be exploited by the LVC code generator 15 to ensure that a local memory module of each core is best utilized by exploiting the locality in the LVC IR 14, by means of code partitioning.

As noted above, there may be three execution models (IPMD, MPMD, and DDMT) that may be chosen for simulation. The multi-core architecture of the LVC chip 11 may be adapted to accommodate these three execution models, as well be discussed in further detail below.

Figure 3:
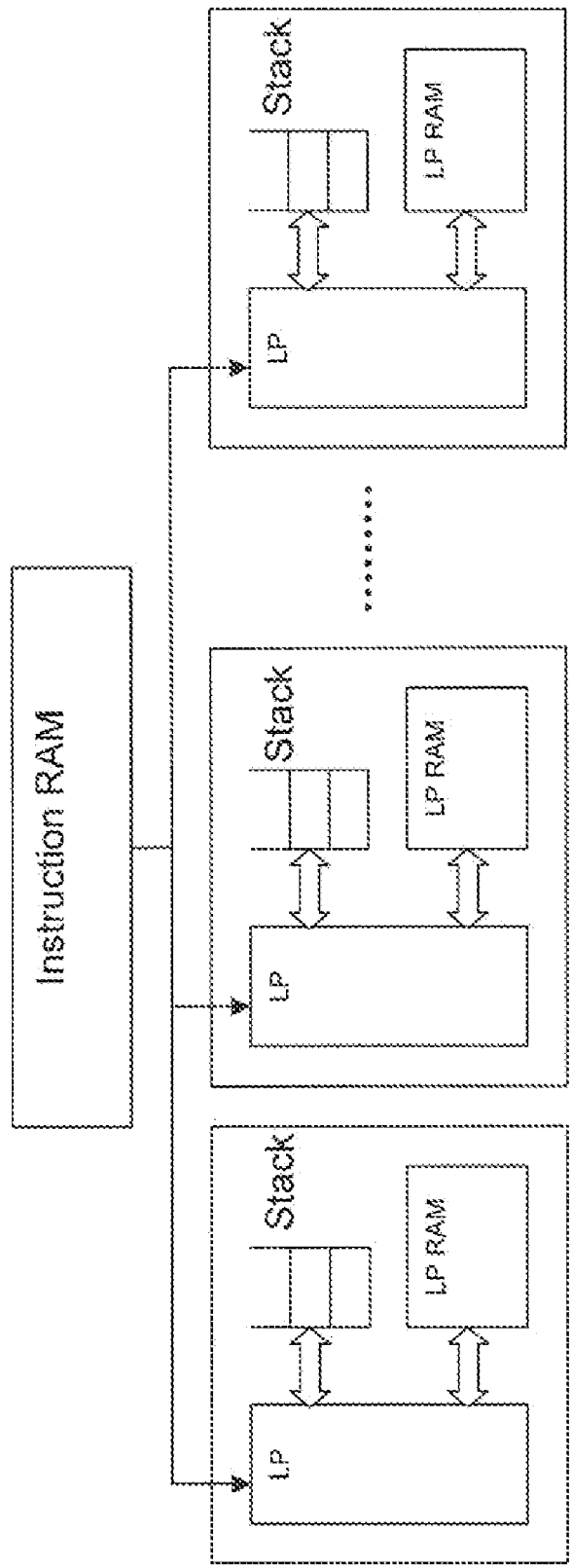
FIG. 3 shows a conceptual block diagram of a particular logic simulation type that may be implemented in some embodiments of the invention.

IPMD may be well-suited to simulate target logic with many repetitive logic modules. As shown in FIG. 3, in the IPMD mode, the LVC chip 11 may have only one instruction stream, and all logic processors (LVCs 112) may be executing exactly the same logic instructions. Because these logic processors may have their own LP RAMs and may be assigned separate memory spaces in off-chip DRAM, they may simulate functionally identical but physically separate logic elements in parallel while sharing the same logic instruction stream.

Figure 4:
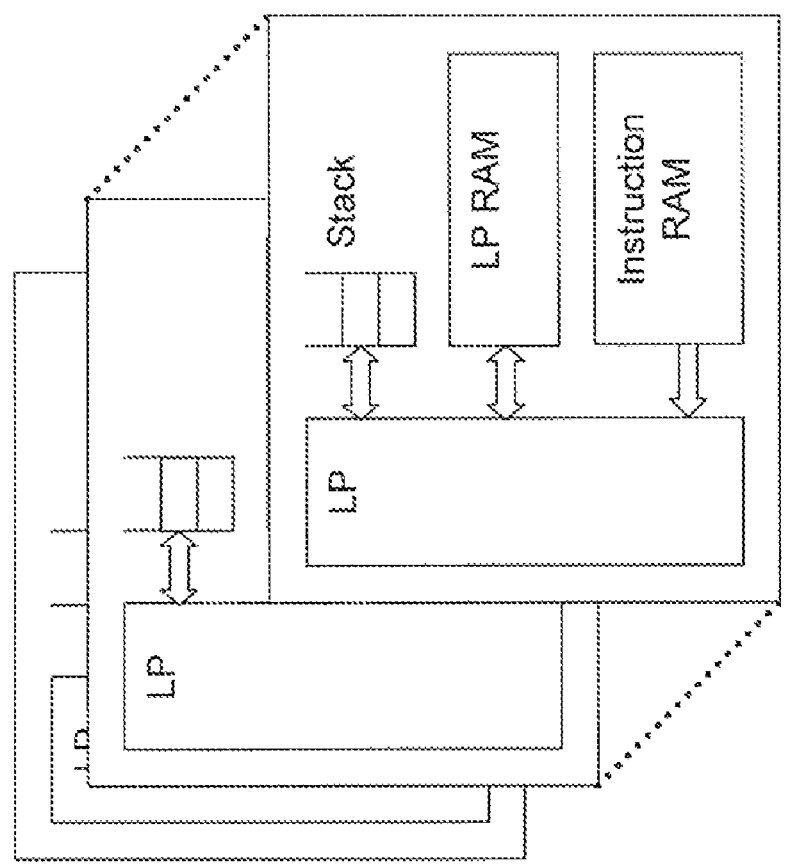
FIG. 4 shows a conceptual block diagram of a particular logic simulation type that may be implemented in some embodiments of the invention.

The LVC chip 11 may also be configured to let different logic processors execute different logic programs. This may be useful when the target logic is partitioned in such a way that not all sub-modules are identical. Even though the instruction sequencer in the LVC chip 11 may be able to support generating multiple instruction streams, the number of the instruction streams may be limited by the number of read ports of the internal instruction RAM. Therefore, the instruction RAM may be designed to be a set of smaller size dual-port RAM blocks, as shown in FIG. 4. Just like the internal RAM blocks of common FPGAs, the connection of these smaller size RAM blocks may be configured. They may be configured to compose a single RAM block, which may be used in IPMD mode (as shown in FIG. 3), or they may be configured to be a number of independent small RAM blocks to provide multiple instruction streams, as shown in FIG. 4.

Figure 5:
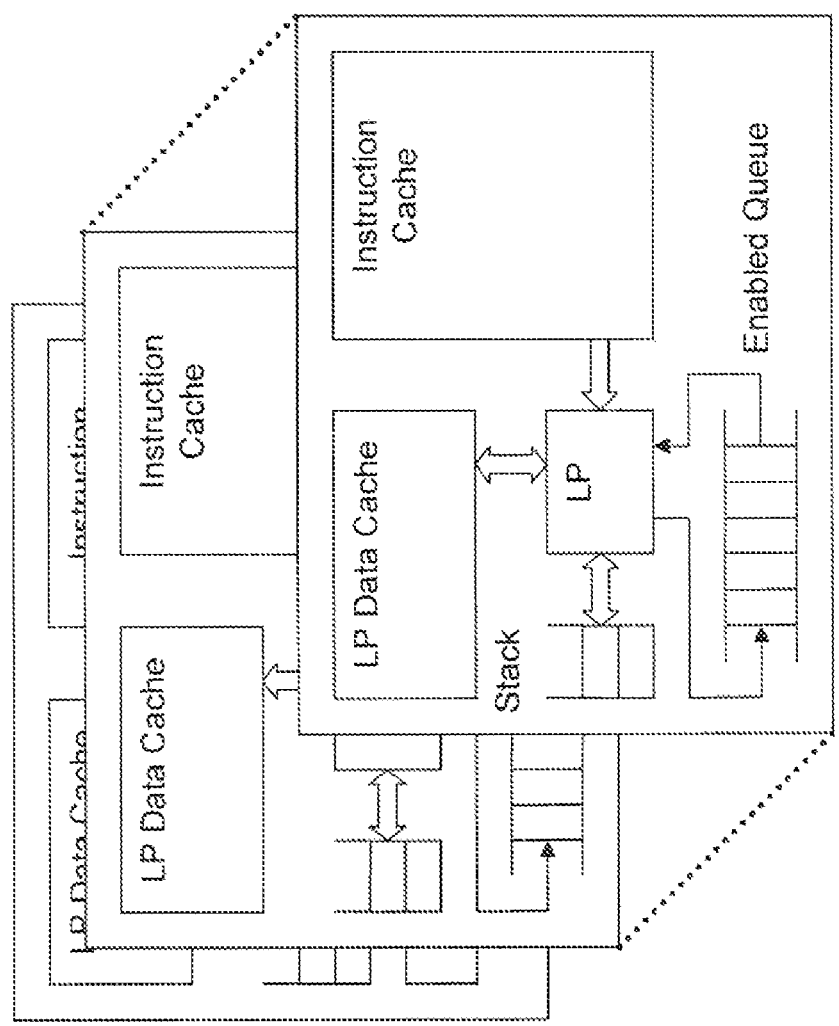
FIG. 5 shows a conceptual block diagram of a particular logic simulation type that may be implemented in some embodiments of the invention.

In the DDMT mode, the LP 1131 may execute the logic instructions generated from a node in the LVC IR 14 only when any of its inputs has changed. In a provisional study, using a simple RISC processor logic as an example, it was discovered that, on average, fewer than 10% of the gates in the processor's logic actually produced different outputs every cycle. Given this, the DDMT mode may be able to save a lot of unnecessary execution time during simulation, and the simulation performance may be able to be significantly improved. As shown in FIG. 5, the LP 1131 may be extended with a conditional enabling instruction that may enable the nodes of the LVC IR 14, which may use the output of a node currently being executed, if the output is changed. LP RAM may be large enough to hold two copies (old and new values) of the outputs of all KSF nodes. In a real system, LP RAM may be implemented with a data cache. No coherent protocol may be needed among multiple LP RAMs because they may typically not share any data. Every LP 1131 may typically have its own execution flow. Therefore, as shown in FIG. 5, a separate instruction RAM may be connected to each of the LPs 1131. Those instruction RAMs may be instruction caches whose data may comes from off-chip RAM. It is expected that the Enabled Queue may have a limited size so that it can fit in the on-chip RAM. If the Enable Queue overflows, an error flag may be set. However, statistically, Enable Queue overflow is not expected to happen very often.

Figure 6:
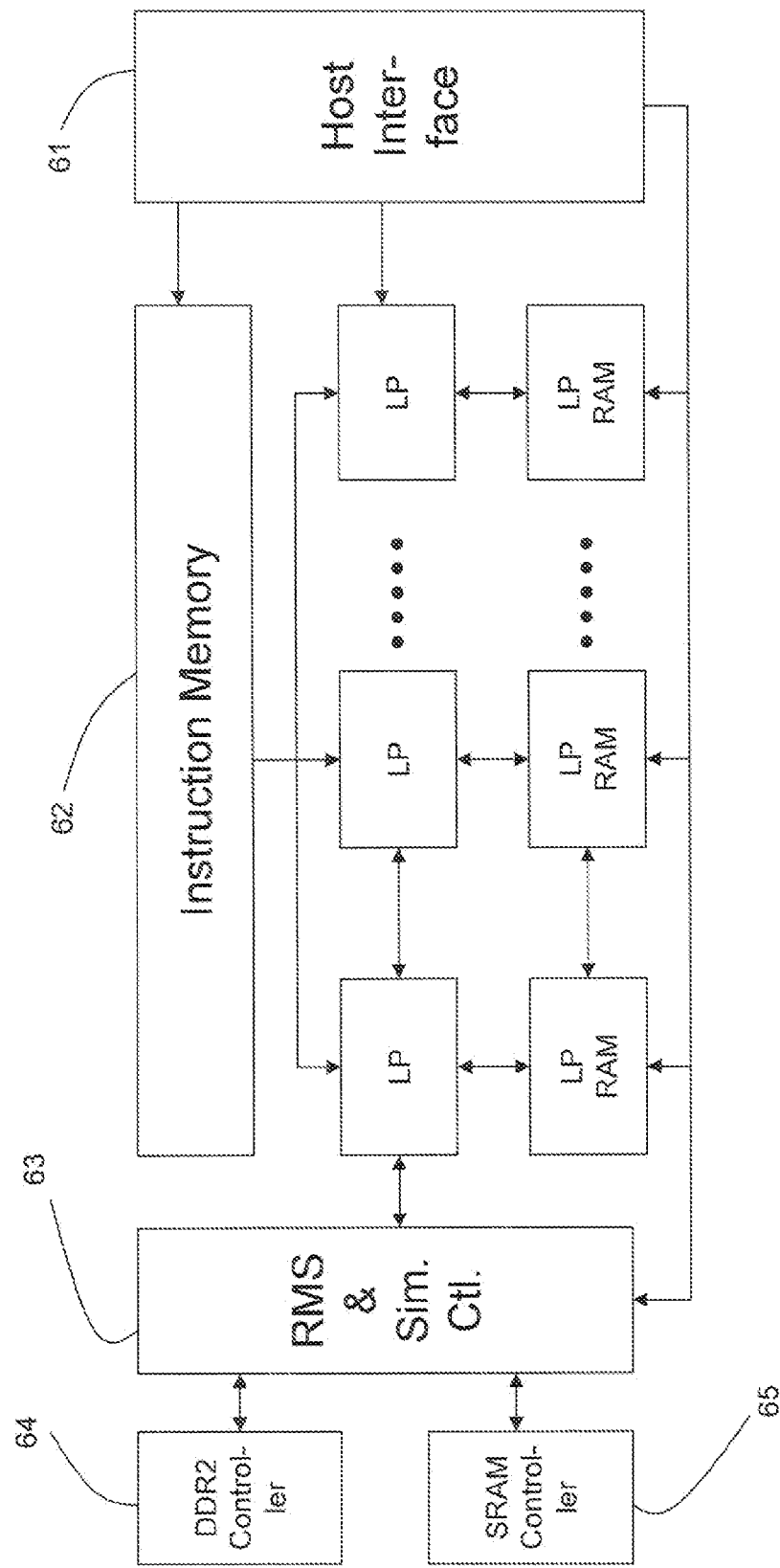
FIG. 6 shows a conceptual block diagram of a system architecture to implement a particular logic simulation type according to an embodiment of the invention.

Some of the functional blocks of the LVC chip 11, configured as an IPMD chip, are shown in FIG. 6, according to an embodiment of the invention. A host interface 61 may be used to enable a user to load instructions into the instruction memory 62 and to load data into LPs and the simulation control unit 63. All LPs may share the same instruction flow in the IPMD chip, and all off-chip memory accesses may be handled by the remote memory access server (RMS) 63. DDR2 controller 64 and SRAM controller 65 may be used to provide interfaces to off-chip DRAM and SRAM modules.

Figure 7:
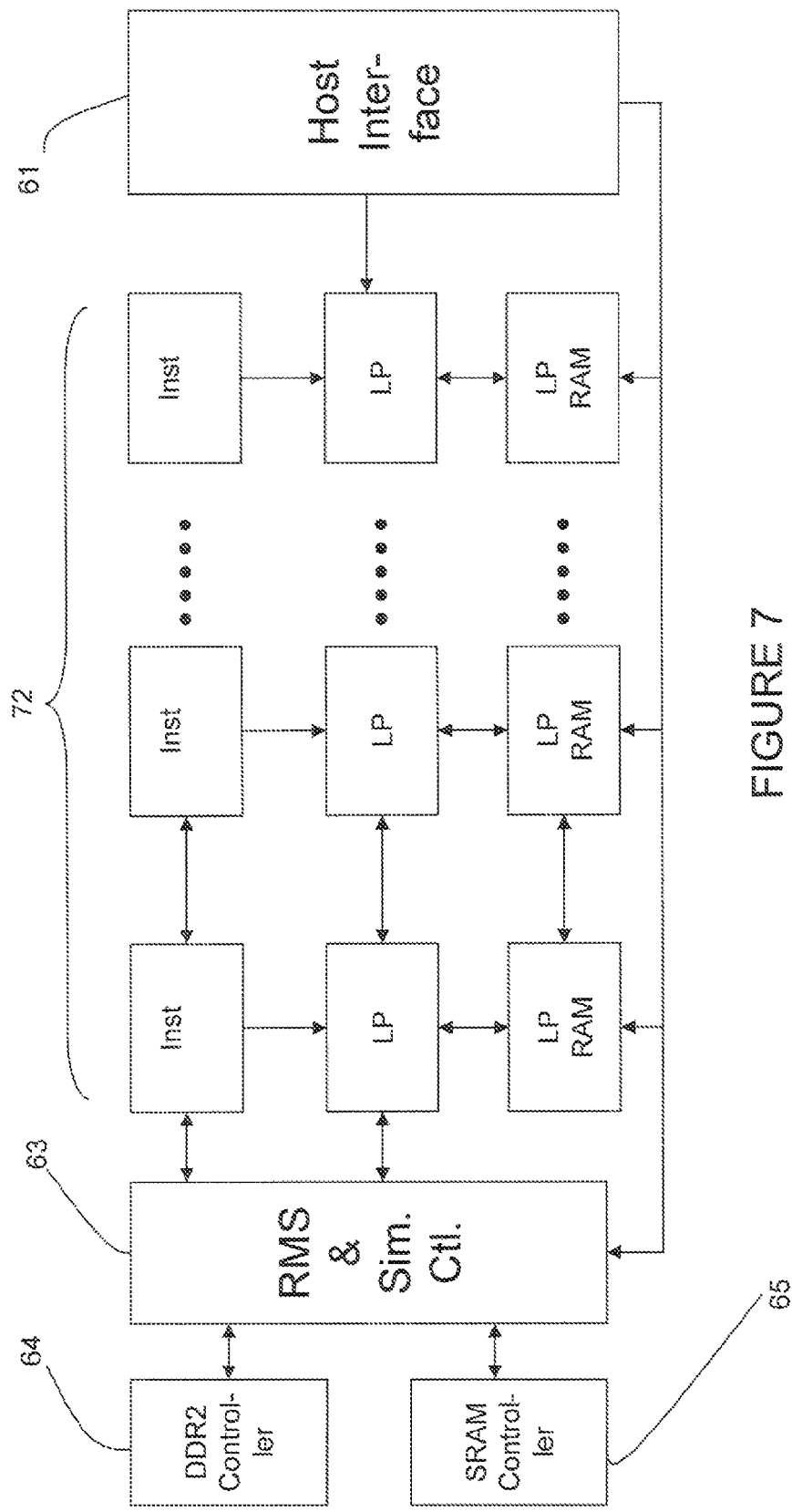
FIG. 7 shows a conceptual block diagram of a system architecture to implement a particular logic simulation type according to an embodiment of the invention.

FIG. 7 shows a corresponding functional block diagram of an LVC chip 11 configured as an MPMD chip, according to an embodiment of the invention. As shown in FIG. 7, embodiments of the MPMD chip may differ from embodiments of IPMD chip in that every LP 1131 may have its own instruction memory block 72. Every LP 1131 may thus have independent instruction flow in parallel during a simulation.

Figure 8:
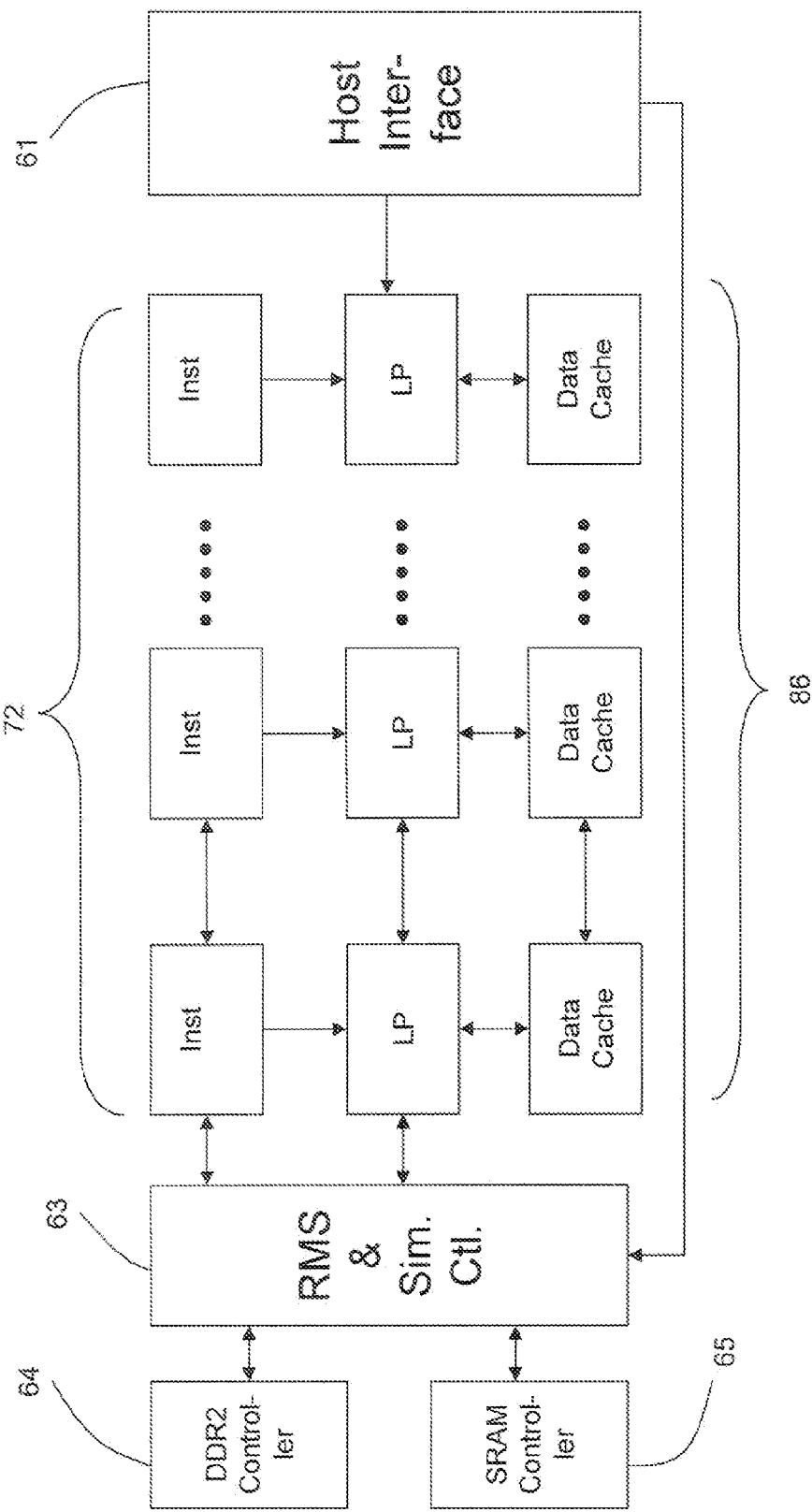
FIG. 8 shows a conceptual block diagram of a system architecture to implement a particular logic simulation type according to an embodiment of the invention.

FIG. 8 shows a similar functional block diagram of an LVC chip 11 configured as a DDMT mode chip, according to an embodiment of the invention. As shown in FIG. 8, every LP 1131 may have its own instruction and data memory caches, 72 and 86, respectively. The caches 86 may hold data from off-chip DRAM and SRAM and may be used to exploit locality in both the simulation program and the simulation data.

Figure 9:
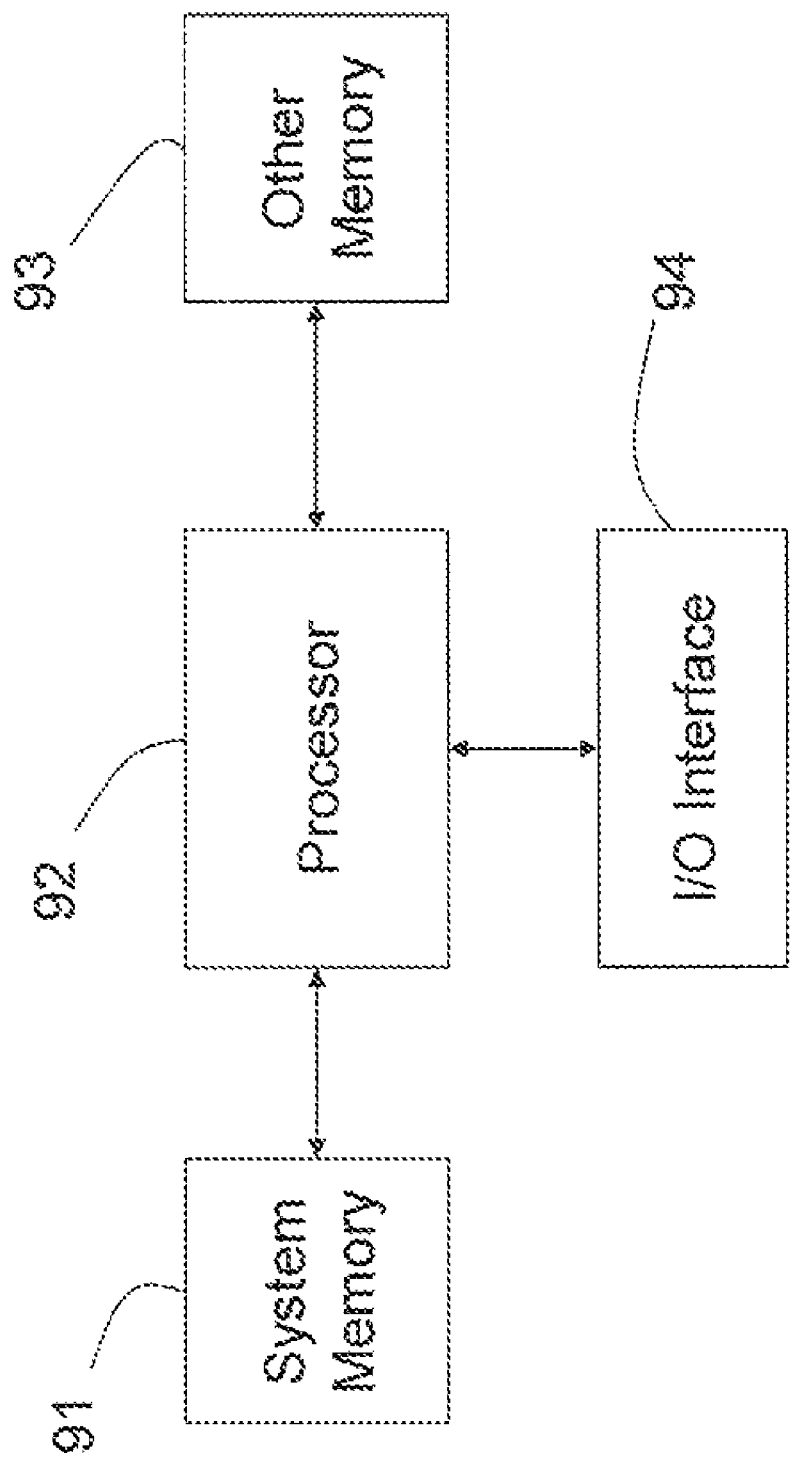
FIG. 9 shows a conceptual block diagram of an exemplary system in which at least some portions of embodiments of the invention may be implemented, and/or which may be used along with various embodiments of the invention.

Various embodiments of the invention may comprise hardware, software, and/or firmware. FIG. 9 shows an exemplary system that may be used to implement various forms and/or portions of embodiments of the invention. Such a computing system may include one or more processors 92, which may be coupled to one or more system memories 91. Such system memory 91 may include, for example, RAM, ROM, or other such machine-readable media, and system memory 91 may be used to incorporate, for example, a basic I/O system (BIOS), operating system, instructions for execution by processor 92, etc. The system may also include further memory 93, such as additional RAM, ROM, hard disk drives, or other processor-readable media. Processor 92 may also be coupled to at least one input/output (I/O) interface 94. I/O interface 94 may include one or more user interfaces, as well as readers for various types of storage media and/or connections to one or more communication networks (e.g., communication interfaces and/or modems), from which, for example, software code may be obtained. Such a computing system may, for example, be used as a platform on which to run translation software and/or to control, house, or interface with an emulation system. Furthermore, other devices/media, such as FPGAs, may also be attached to and interact with the system shown in FIG. 9.

Various embodiments of the invention have now been discussed in detail; however, the invention should not be understood as being limited to these embodiments. It should also be appreciated that various modifications, adaptations, and alternative embodiments thereof may be made within the scope and spirit of the present invention.

What is claimed is:

1. A logic simulation integrated circuit comprising:
a multiplicity of fixed-instruction-width core processors;
a multiplicity of local memory blocks, each local memory block associated with one of said core processors; and
instruction memory coupled to said core processors,
wherein said core processors are to execute instructions in parallel;
wherein said instruction memory is to provide at least one logic instruction to one or more of said core processors, in parallel; and
wherein said integrated circuit is tailored to implement an execution model selected from the group consisting of: identical program multiple data (IPMD), multiple program multiple data (MPMD), and data-driven multi-threaded (DDMT).

2. The integrated circuit according to claim 1, wherein said local memory blocks comprise a multiplicity of separate local memory blocks.

3. The integrated circuit according to claim 2, wherein each separate local memory block comprises a data cache to hold data from off-chip memory.

4. The integrated circuit according to claim 1, wherein said instruction memory comprises a multiplicity of parallel instruction memories, each to provide one or more instructions to one of said core processors.

5. The integrated circuit according to claim 1, further comprising:
a host interface coupled to said core processors and to said instruction memory; and
a control module coupled to said processors and to said host interface.

6. The integrated circuit according to claim 5, further comprising:
one or more memory access controllers coupled to said control module and to one or more off-chip memory components.

7. The integrated circuit according to claim 1, wherein the integrated circuit is to implement an IPMD execution model, wherein the instruction memory is to provide a common instruction in parallel to each of the core processors, and wherein each of said core processors is associated with separate memory space in at least one off-chip memory component.

8. The integrated circuit according to claim 1, wherein the integrated circuit is to implement an MPMD execution model, wherein the distinction memory is to provide multiple instructions, in parallel, to the multiplicity of core processors, wherein at least two of the multiple instructions are different from each other.

9. The integrated circuit according to claim 1, wherein the integrated circuit is to implement a DDMT memory, wherein the instruction memory is to provide multiple instructions, in parallel, to the multiplicity of core processors, wherein at least two of the multiple instructions are different from each other, and wherein the instruction memory comprises multiple parallel instruction memories, each coupled to one of the respective core processors.

10. The integrated circuit according to claim 9, further comprising a multiplicity of enable queues, each associated with and coupled to a respective one of said core processors.

11. A simulation system comprising:
a host computer system comprising at least one processor and a machine-readable medium containing software code that, if executed by the at least one processor, causes the at least one processor to implement a method of preparing code for execution by a multi-core logic simulation system, the method comprising:
translating a target logic design froth a high-level logic design language to an intermediate form comprising code lines, each code line including at least one logic operation and one or more data dependencies with respect to one or more other operations in the code lines; and
translating the intermediate code into fixed-width instructions to be executed by core processors of said multi-core logic simulation system; and
a logic simulation integrated-circuit device coupled to said host computer system and comprising:
a multiplicity of fixed-instruction-width core processors;
a multiplicity of local memory blocks, each local memory block associated with one of said core processors; and
instruction memory coupled to said core processors,
wherein said core processors are to execute instructions in parallel;
wherein said instruction memory is to provide at least one logic instruction to one or more of said core processors, in parallel; and
wherein said integrated-circuit device is tailored to implement an execution model selected from the group consisting of: identical program multiple data (IPMD), multiple program multiple data (MPMD), and data-driven multi-threaded (DDMT).

* * * * *